United States Patent [19]

Hung

[11] Patent Number: 5,430,610
[45] Date of Patent: Jul. 4, 1995

[54] SEPARABLE POSITIONING DEVICE FOR THE HEAT SINK ON COMPUTER CHIPS

[76] Inventor: Chin-Ping Hung, No. 42, Wen-Hwa Road, Chung-Li, Taiwan

[21] Appl. No.: 260,732
[22] Filed: Jun. 15, 1994
[51] Int. Cl.⁶ .............................................. H05K 7/20
[52] U.S. Cl. .................... 361/697; 165/80.3; 165/122; 415/178
[58] Field of Search .......... 165/80.3, 185, 122, 165/124–126; 257/718, 719, 722, 726, 727; 310/62–64, 67 R, 71; 361/694–697; 415/175–178, 213.1, 214.1, 220

[56] References Cited

U.S. PATENT DOCUMENTS

| | | | |
|---|---|---|---|
| 5,288,203 | 2/1994 | Thomas | 361/694 |
| 5,299,632 | 4/1994 | Lee | 361/697 |
| 5,309,983 | 5/1994 | Bailey | 361/697 |
| 5,335,722 | 8/1994 | Wu | 165/80.3 |

Primary Examiner—Gregory D. Thompson
Attorney, Agent, or Firm—Bacon & Thomas

[57] ABSTRACT

A positioning device for a heat sink on computer chips (CPU) includes a seat placed on the CPU for mounting a fan and having a fixed clamping member on one end for hooking onto a shoulder of the CPU and a movable clamping member for hooking another shoulder of the CPU. An elastic element is disposed between the seat and the movable clamping member to enable the movable clamping member to hook the CPU by the restoring force thereof and which has two ends extending to both sides of the seat which are folded down to abut both ends of the CPU opposite to each other.

6 Claims, 6 Drawing Sheets

SEPARABLE POSITIONING DEVICE FOR THE HEAT SINK ON COMPUTER CHIPS

BACKGROUND OF THE INVENTION

1. Field of the Invention

The present invention relates to a separable positioning device for the heat sink on computer chips, and especially to one which can be a fixing device for a heat sinking fan on a CPU. The invention includes a seat for mounting at least the fan, a movable clamping member and an elastic element. The seat has a fixed clamping member on one end thereof, the movable clamping member has a clamping effect by the function of the elastic element, which has on its both ends, two stop members. When the seat is clamped in position in a left-rightward orientation on the CPU by the clamping members, the stop members abut respectively the front and rear sides of the CPU, thus clamping and positioning in an easy and simple way to enable convenient assembling.

2. Description of the Prior Art

To avoid adverse influence to the normal operation of a CPU and damage thereto by the high temperature produced by operation of the CPU itself, the resolution currently used is to add a heat sink having a fan and a seat on the top of the CPU. The high temperature conducted from the CPU to the seat is blown off by the fan, so the seat should not only have good conductivity, but also must be capable of having the fan mounted thereon as well as being attached to and fixed on the top of the CPU. The function of mounting can be achieved only by screwing the fan tightly on the top of the seat. The requirement of being attached to and fixed on the top of the CPU, yet not letting the CPU be damaged and letting assembling of them be simple and easy can not easily be achieved. Although the fixing mode currently used for the seat of a heat sink will not damage the CPU, the assembling of them has nevertheless a lot of disadvantages. The fixing mode and the structure thereof are now discussed as follows:

1. In the fixing mode as shown in FIG. 4, a layer of adhesive A is applied directly on the back of a CPU, then a heat sink B is adhered to the CPU. The adhesive A is not a good conductor and the heat sinking effect of the heat sink B is therefor reduced. Moreover, if the glued heat sink B is to be dismounted for repairing or changing, the CPU should be dismounted too, which is not economical.

2. As shown in FIG. 5, after the heat sink B therein is put on the back of a CPU, a plurality of hooks C are used to clamp them together. The elastic hooks C are subjected to dropping off when being moved or being vibrated.

3. In the fixing mode as shown in FIG. 6, a frame D with a clamping member E is added and fixed to the periphery of a CPU. After the heat sink B therein is put on the back of the CPU, the frame D locates the heat sink B in a horizontal position (as shown in FIG. 7). The clamping member E is used to compress the heat sink B, and hold it tightly in position on the frame D by the hooks E1 provided on both ends of the clamping member E. There is no worries about poor conduction of heat or it being subjected to dropping in such a fixing mode. However, it costs and space needs, as well as increases in the assembling process to add a frame D and a clamping member E, is no good for the efficiency of the assembly.

4. Others such as the heat sink F shown in FIG. 8 can only be horizontally fixed in position in a longitudinal orientation, while the two sides having a plurality of pins G cannot be used for fixing.

In view of this, the inventor of the present invention studied and developed a heat sink for computer chips, and filed in the United States Patent and Trademark office an application for patent in the title of "Bipartite heat positioning device for computer chips" and having a filing Ser. No. 08/144,432, now pending. This heat sink has different space arrangement and character in its shape, and is not to be described in detail.

SUMMARY OF THE INVENTION

Specifically, the separable positioning device for the chips on a computer of the present invention includes at least a seat for mounting a fan, the top of the seat which abuts the fan has a plurality of heat sinking leaves. There is a fixed clamping member on one side of the seat and a folded hook is provided on the bottom of the fixed clamping member. When the bottom of the seat is located on the top of the computer chip (CPU), the hook can hook onto a shoulder of the CPU. Another movable clamping member having another hook is provided on the bottom of the seat on the other side thereof for hooking another shoulder of the CPU. The top end of this movable clamping member extends to the top of the CPU close to a lateral side neighboring thereto of the seat opposite to the fixed clamping member. The top end forms a fixing portion. An elastic element is provided between the seat and the movable clamping member, so that the movable clamping member can be pivoted upwardly and downwardly. Both ends of the elastic element extend to both sides of the seat without any abutting of clamping member and further are folded down to form two stop members to abut both ends of the CPU which are opposite to each other.

The main object of the present invention is to provide a separable positioning device for the heat sink on computer chips, wherein the fixed as well as the movable clamping members, which individually hooks a shoulder of the CPU, will prevent the seat of the heat sink from being lifted off. If the members are provided respectively on the left and right sides of the seat, then the seat will be limited leftwardly and rightwardly, and two stop members on both ends of the elastic element will limit movement of the seat frontwardly and rearwardly, so that the seat having a fan thereon can be clung to and fixed on the top of the CPU.

A second object of the present invention is to provide a separable positioning device for the heat sink on computer chips in which, in assembling, the movable clamping member is lifted up to allow the fixed clamping member to hook a shoulder of the CPU. After the bottom of the seat clings to the top of the CPU, the movable clamping member is released to allow it to clamp the CPU by restoring force of the elastic element, thus the assembling is completed and is easy.

Another object of the present invention is to provide a separable positioning device for the heat sink on computer chips having a structure wherein the movable clamping member thereof can be provided upwardly and downwardly by the elastic element and can be conveniently detached for maintenance.

The present invention will be apparent as will the characteristics and functions thereof after reading the

DETAILED DESCRIPTION OF THE PREFERRED EMBODIMENT

Figure 1:
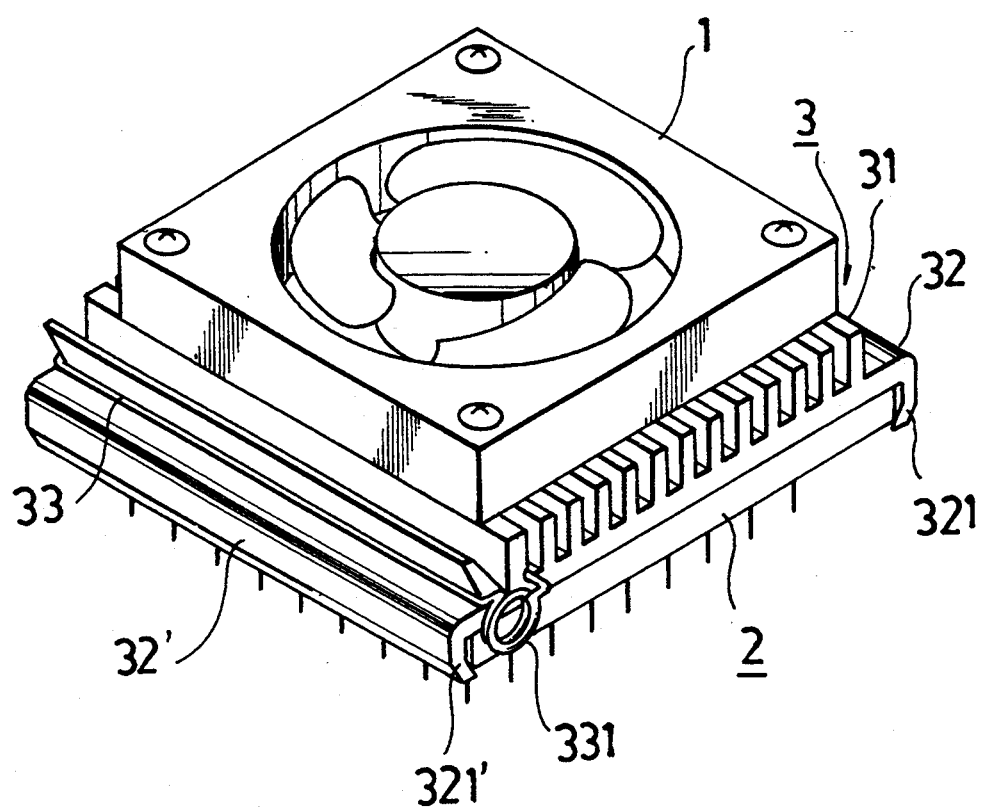
FIG. 1 is an assembled perspective view of a preferred embodiment of the present invention.

It can be seen in FIG. 1 that the separable positioning device for the heat sink on computer chips of the present invention includes at least a seat 3 placed between a fan 1 and the chips (CPU) 2. The top end of the seat 3 which abuts the fan 1 has a plurality of heat sinking leaves 31. At one side of the seat 3 there is a fixed clamping member 32 with a hook 321 on the bottom thereof for hooking onto a shoulder of the CPU 2. A movable clamping member 32' is provided on an opposite side having another hook 321' on the bottom end thereof for hooking another shoulder of the CPU 2. The top of the clamping member 32' extends to the top of the CPU 2 close to the neighboring lateral side of the seat 3 opposite to the fixed clamping member 32. An elastic element 33 is placed between the seat 3 and the movable clamping member 32' so that the movable clamping member 32' can clamp a shoulder of the CPU by a restoring force of the elastic element 33. Two ends of the elastic element 33 extends sidewardly to both sides of the seat 3 without abutting of any clamping member and are folded down to form two stop members 331 for abutting both sides of the CPU 2.

Figure 2:
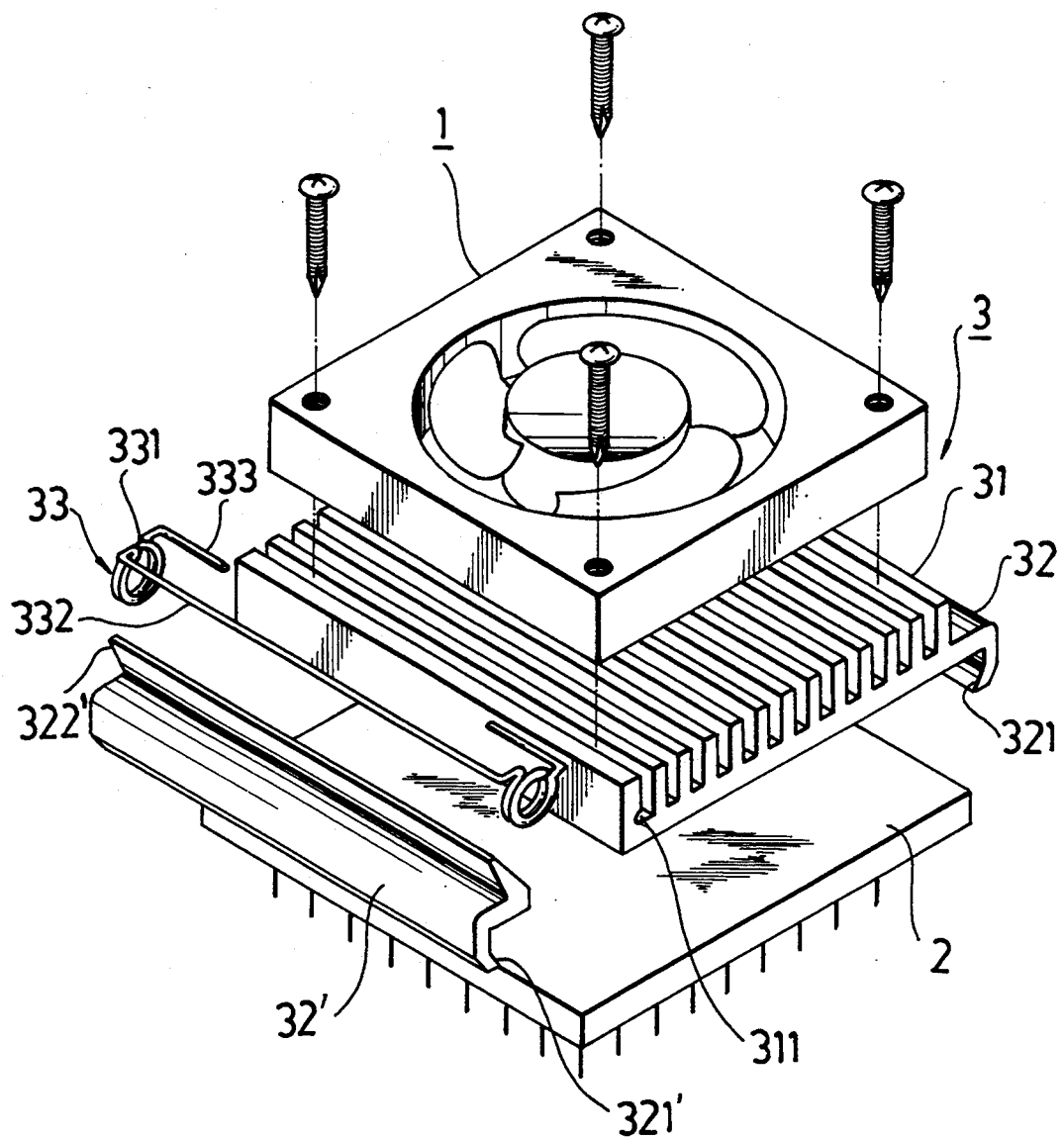
FIG. 2 is an exploded perspective view of the preferred embodiment of FIG. 1.

The movable clamping member 32' has in the vicinity of the seat 3 a fixing portion 322' extending upwardly (referring to FIG. 2). The leaves 31 in the vicinity of the fixing portion 322' of the seat 3 have a receiving groove 311. The elastic element 33 is formed of a metallic wire 332 which has two ends folded down and wound for several turns to form the above mentioned stop members 311, the elasticity thereof being provided by the windings of the wire 322. A pair of fixing bars 333 are provided at the ends of the windings opposite to each other. In placing the elastic element 33 between the seat 3 and the fixing portion 322', the shaft of the wire 332 and the fixing bars 333 of the elastic element 33 can be inserted respectively in the receiving groove 311 and the fixing portion 322', so that the movable clamping member 32' can be pivoted at the lateral side of the seat 3. The area of the seat 3 should at least be adequate for accepting the fan 1 so as not to restrict pivoting of the movable clamping member 32. The fan 1 can be mounted at any time, before or after the assembling of the seat 3 and the CPU 2, and will not influence the process of assembling the seat 3 and the CPU 2.

Figure 3A:
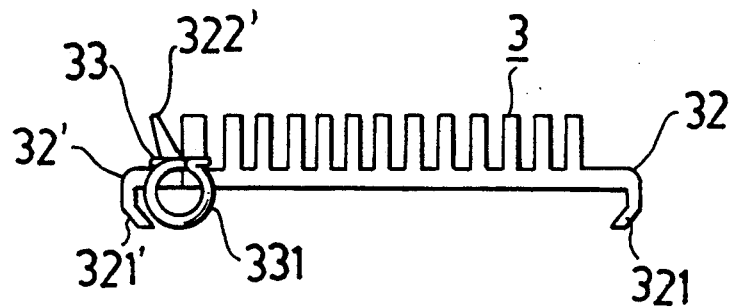
FIG. 3A is a side view of the assembled embodiment of the present invention.
Figure 3B:
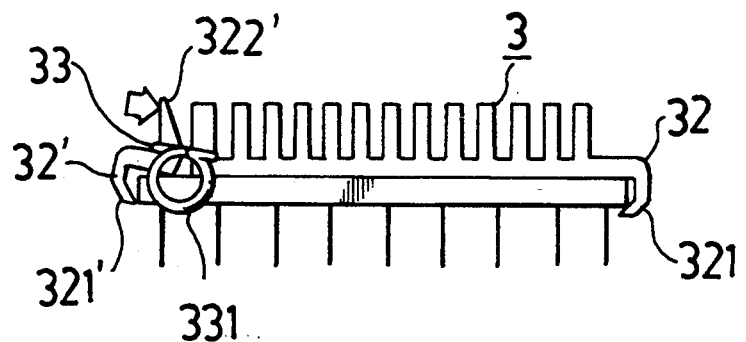
FIG. 3B is a schematic side view of the present invention, showing the pivotal action of the movable clamping member through the elastic element.
Figure 3C:
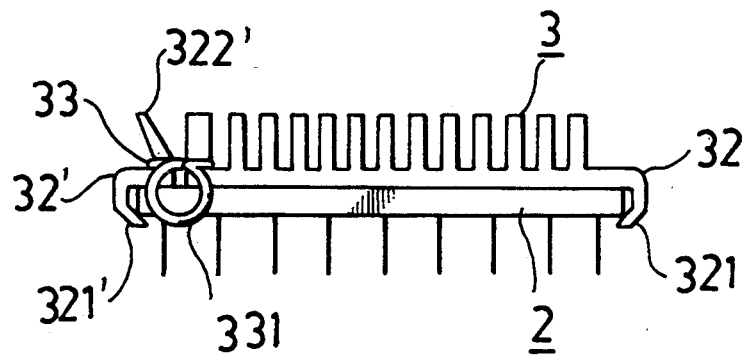
FIG. 3C is a schematic side view, showing the present invention is limited relative to its position by the movable clamping member and the fixed clamping member.
Figure 3D:
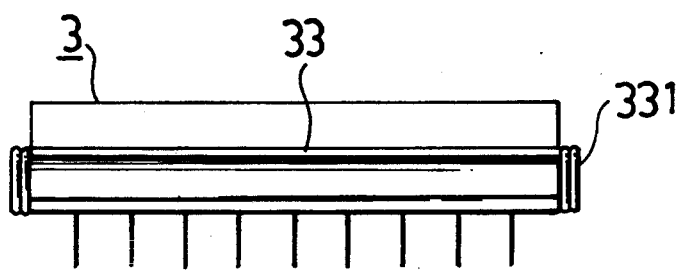
FIG. 3D is a front view showing the present invention is limited relative to its position by the stop members of the elastic element.
Figure 4:
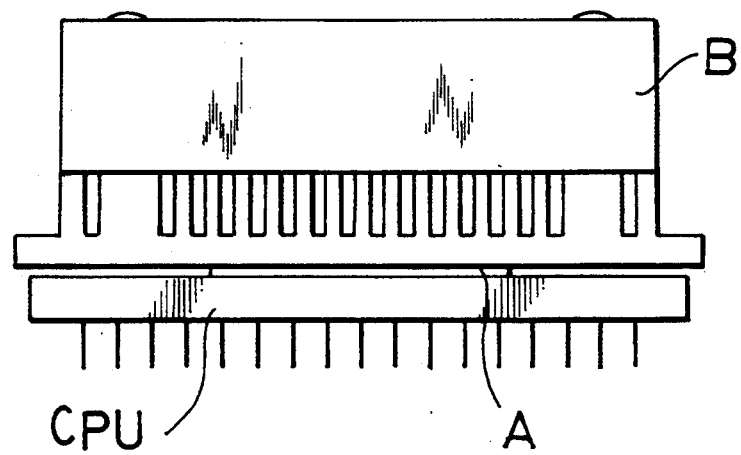
FIG. 4 is a side view of a first fixing structure for a conventional seat of a heat sink.
Figure 5:
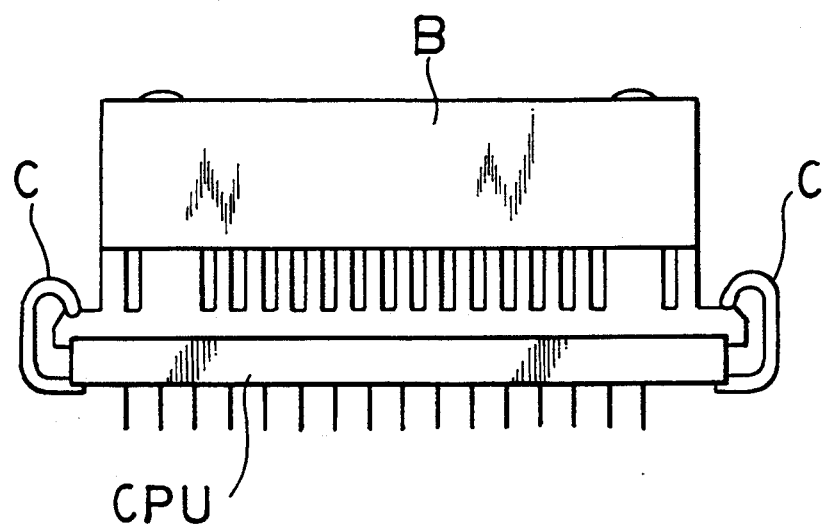
FIG. 5 is a side view of a second fixing structure for a conventional seat of a heat sink.
Figure 6:
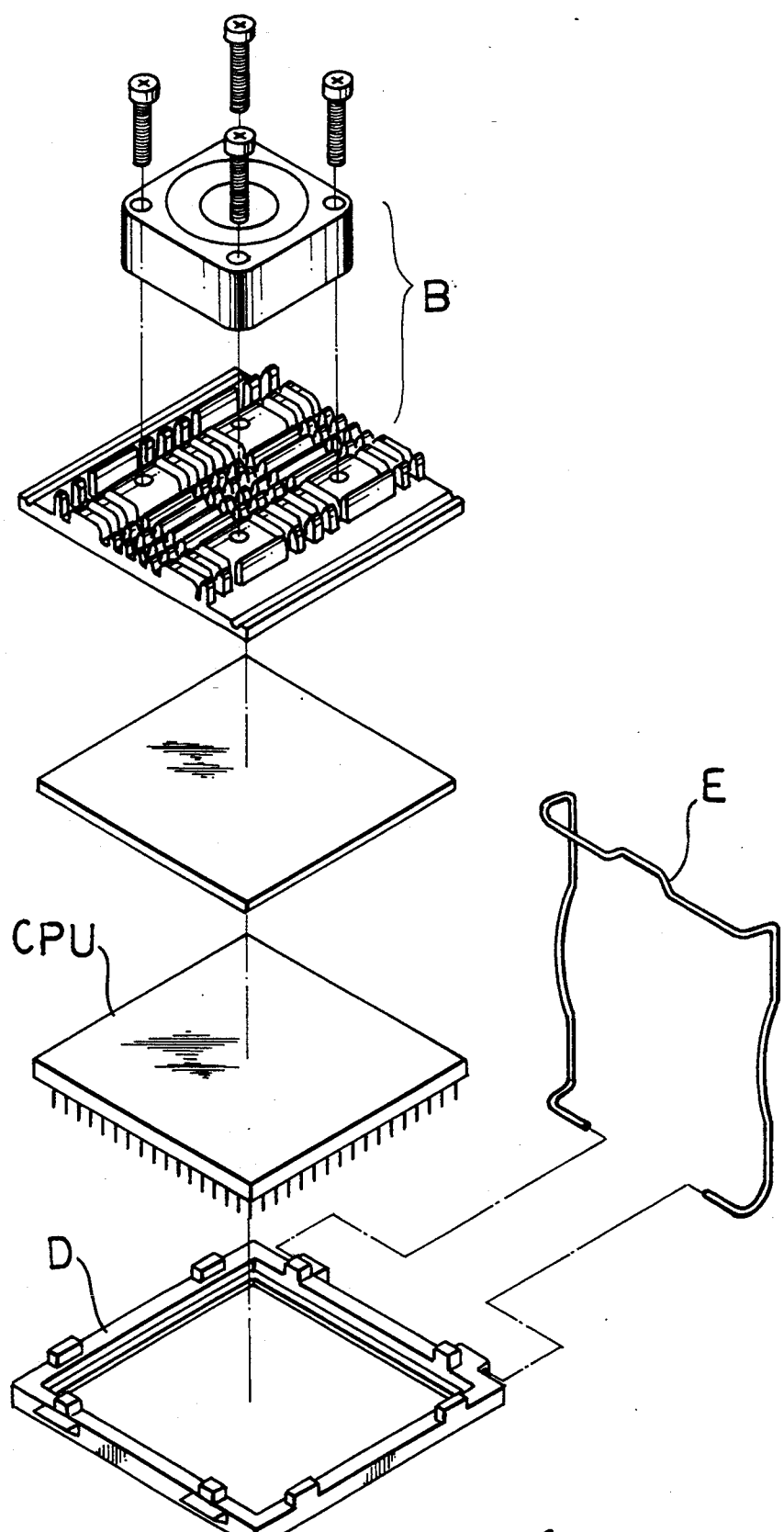
FIG. 6 is an exploded perspective view of a third fixing structure for a conventional seat of a heat sink.
Figure 7:
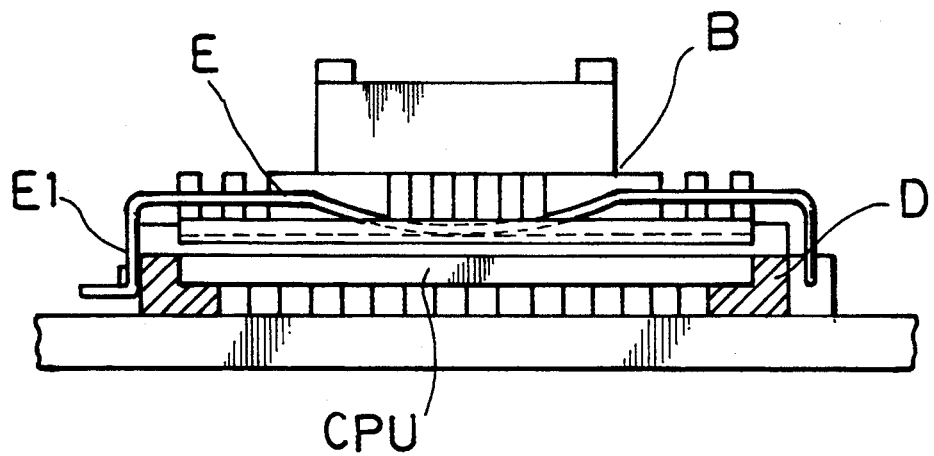
FIG. 7 is an assembled side view of the third fixing structure as shown in FIG. 6.
Figure 8:
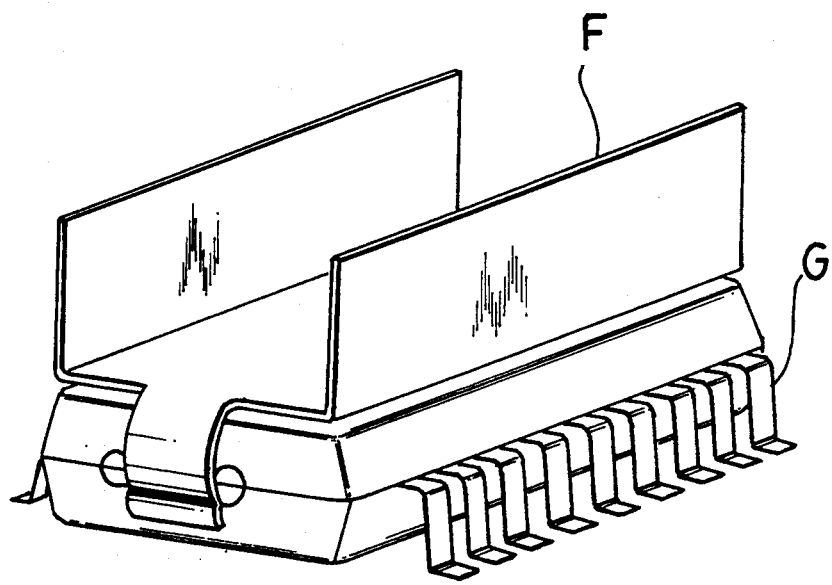
FIG. 8 is a perspective view of a fourth fixing structure for a conventional seat of a heat sink.

The process of installation of the present invention and the CPU 2 is shown in FIGS. 3A–3C. FIG. 3A is a side view of the present invention showing the basic forms of the seat 3, the movable clamping member 32' and the elastic element 33 after assembling. The movable clamping member 32' can be pivoted at one side of the seat 3 by the elastic element 33. When it is desired to fix the seat 3 on the top of the CPU 2, the fixing portion 322' of the movable clamping member 32' is pressed inwardly, causing the movable clamping member 32' and its bottom hook 321' to be lifted (referring to FIG. 3B). The seat 3 of the heat sink can then be placed on the top of the CPU 2, and the hook 321 on the bottom of the fixed clamping member 32 can hook a shoulder of the CPU 2. Then the movable clamping member 32' is released to allow its bottom hook 321' to hook the CPU 2 by means of the restoring force of the elastic element 33 (referring to FIG. 3C). At this moment, the clamping members 32, 32' on both sides of the seat 3 can limit the movement of the seat 3 leftwardly and rightwardly through the restoring force of the elastic element 33. The hook 321 folded down and inwardly and extending to the base portion of the CPU 2 can tightly hold the CPU 2 and the seat together. The two stop members 331 of the elastic element 33 (referring to FIG. 3D) can further limit the movement of the seat 3 frontwardly and rearwardly, in this way, the assembling of the seat 3 and the CPU 2 can be completed. When it is desired to detach them, one needs only to press the fixing portion 322' of the movable clamping member 32' to lift off the movable clamping member 32' for maintenance. Thus the effect of easy assembling, as well as detaching and firm combination of them is achieved.

Obviously, many modifications and variations of the present invention are possible in the light of the above teachings. It is therefore to be understood that within the scope of the appended claims, the invention may be practiced otherwise than as specifically described.

I claim:

1. A separable heat sink for a CPU comprising:
  a seat having a fan thereon, the seat comprising a fixed clamping member on one side of said seat, the first clamping member having a folded first hook provided on a bottom thereof configured to engaged a first shoulder of said CPU;
  a movable clamping member movable between open and closed positions and having a second hook provided on a bottom thereof configured to engage a second shoulder of said CPU opposite said first shoulder when the movable clamping member is in its closed position, a top end of said movable clamping member being located adjacent to a lateral side of said seat; and
  an elastic element connecting said seat and said movable clamping member so as to bias the movable clamping member toward its closed position, the elastic element having opposite ends extending to opposite sides of said seat wherein said ends are folded down to form two stop members to abutting opposite sides of said CPU.

2. The separable heat sink as stated in claim 1, wherein said elastic element comprises: a metallic wire in which: the opposite ends are folded down and wound for several turns to form windings constituting said stop members; and the opposite ends also form a pair of fixing bars extending parallel to each other so as to engage the seat.

3. The separable heat sink as stated in claim 2, wherein said seat has a receiving groove located adjacent to said movable clamping member to receive fixing bars of the elastic element and said movable clamping member has a fixing portion located opposite to said receiving groove, so as to receive a portion of the elastic element.

4. The separable heat sink as stated in claim 3, wherein a top portion of said seat is provided with a plurality of heat sinking leaves extending parallel to said fixed clamping member, and wherein said receiving groove is provided on a base of one of said leaves adjacent to said movable clamping member.

5. The separable heat sink as stated in claim 3, wherein said fixing portion is formed by an upper portion of said movable clamping member located adjacent to said seat.

6. The separable heat sink as stated in claim 1, said first and second hooks extend down and inwardly for hooking shoulders of said CPU.

* * * * *